United States Patent
Seo et al.

(10) Patent No.: US 7,123,520 B2
(45) Date of Patent: Oct. 17, 2006

(54) BUFFER CIRCUIT AND MEMORY SYSTEM FOR SELECTIVELY OUTPUTTING DATA STROBE SIGNAL ACCORDING TO NUMBER OF DATA BITS

(75) Inventors: Sung-min Seo, Yongin-si (KR); Chul-soo Kim, Suwon-si (KR); Kyu-hyoun Kim, Suwon-si (KR); Jin-kyoung Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 10/884,723

(22) Filed: Jul. 2, 2004

(65) Prior Publication Data
US 2005/0111273 A1    May 26, 2005

(30) Foreign Application Priority Data
Jul. 4, 2003    (KR)    ................. 10-2003-0045395

(51) Int. Cl.
*G11C 16/10* (2006.01)

(52) U.S. Cl. .................. 365/189.05; 365/195; 365/191

(58) Field of Classification Search ........... 365/189.05, 365/195, 191, 200, 189.08, 230.08
See application file for complete search history.

(56) References Cited

U.S. PATENT DOCUMENTS 6,188,619 B1 *    2/2001    Jung ........................ 365/200
2004/0090846 A1 *    5/2004    Eto et al. .................... 365/200

* cited by examiner

*Primary Examiner*—Tuan T. Nguyen
*Assistant Examiner*—Dang Nguyen
(74) *Attorney, Agent, or Firm*—Mills & Onello LLP

(57) ABSTRACT

Provided are a buffer circuit and a memory system for selectively outputting a data strobe signal according to the number of data bits. The buffer circuit includes a first buffer unit, a second buffer unit, and a third buffer unit. The first buffer unit amplifies and outputs a first signal. The second buffer unit amplifies and outputs a second signal or outputs the first signal according to the logic level of a control signal. The third buffer unit amplifies the first signal to send or not to send the amplified first signal to the second buffer unit depending on the logic level of an inverted control signal. The logic levels of the control signal and the inverted control signal are determined according to the number of processed data bits. When the number of processed data bits is n, the control signal is set to a first level and the inverted control signal is set to a second level, and when the number of processed data bits is k, the control signal is set to a second level and the inverted control signal is set to a first level. Since the buffer circuit and the memory system selectively output the data strobe signal according to the number of data bits, a point of time when the data are latched can be advanced and a setup/hold time of the data can be reduced.

10 Claims, 4 Drawing Sheets

US 7,123,520 B2

BUFFER CIRCUIT AND MEMORY SYSTEM FOR SELECTIVELY OUTPUTTING DATA STROBE SIGNAL ACCORDING TO NUMBER OF DATA BITS

This application claims the priority of Korean Patent Application No. 2003-45395, filed on Jul. 4, 2003, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a buffer circuit and a memory system which select a data strobe signal to output according to a number of data bits.

2. Description of the Related Art

In general, data applied to a memory array are synchronized with a data strobe signal.

FIG. 1 is a block diagram illustrating a process in which data to be applied to a memory array are synchronized with a data strobe signal.

A data strobe signal is generally used to process data in units of bytes. Thus, to process data DATA of 16 bits, a 16-bit data strobe signal is divided into two 8-bit signals. One signal is an upper data strobe signal UDQS, and the other signal is a lower data strobe signal LDQS.

When 16-bit data DATA is input, the upper data strobe signal UDQS latches an input of [8:15] data DATA, and the lower data strobe signal LDQS latches an input of [0:7] data DATA.

When 16 bits of data DATA are input, the upper data strobe signal UDQS buffered by a first input buffer 110 is applied as an upper latch data strobe signal PUDQS to a latch unit 140 through a switching unit 130.

The lower data strobe signal LDQS buffered by a second input buffer 120 is applied as a lower latch data strobe signal PLDQS to the latch unit 140 through the switching unit 130. The data DATA are synchronized with the upper and lower data strobe signals UDQS and LDQS and are applied to a memory array.

However, when 8 bits of data DATA are input, the input 8 data are latched using 8 data strobe signals among 16 data strobe signals by a bonding option.

Here, the upper data strobe signal UDQS, instead of the lower data strobe signal LDQS which is used as a reference signal for latching the 16 bits of data, generates the lower latch data strobe signal PLDQS through the switching unit 130.

That is to say, when 16 bits of data are processed, the upper data strobe signal UDQS applies the upper latch data strobe signal PUDQS to the latch unit 140 and the lower data strobe signal LDQS applies the lower latch data strobe signal PLDQS to the latch unit 140. The input 16 bits of data DATA to be applied to the memory array are synchronized with the upper latch data strobe signal PUDQS and the lower latch data strobe signal PLDQS.

However, when 8 bits of data are processed, the upper data strobe signal UDQS applies the upper latch data strobe signal PUDQS to the latch unit 140, and also applies the lower latch data strobe signal PLDQS to the latch unit 140. The upper latch data strobe signal PUDQS and the lower latch data strobe signal PLDQS are used as synchronizing signals of data DATA which are only input in units of 4 bits.

In more detail, when the processed data DATA are 16 bits, a control signal CTRL input to the switching unit 130 is set to a first level, whereas when the processed data DATA are 8 bits, it is set to a second level.

Thus, when the control signal CTRL is set to a first level, the switching unit 130 allows the upper data strobe signal UDQS to generate the upper latch data strobe signal PUDQS, and allows the lower data strobe signal LDQS to generate the lower latch data strobe signal PLDQS.

However, when the control signal CTRL is set to a second level, the switching unit 130 allows the upper data strobe signal UDQS to generate both the upper latch data strobe signal PUDQS and the lower latch data strobe signal PLDQS.

Such an operation is performed when the input data DATA are 4 bits as well. That is, except the case where the input data DATa are 16 bits, the upper data strobe signal UDQS generates both the upper latch data strobe signal PUDQS and the lower latch data strobe signal PLDQS.

FIG. 2 is a block diagram of the switching unit shown In FIG. 1.

Referring to FIG. 2, the switching unit 130 includes a first switch 210 which outputs the signal TUDQS obtained by buffering the upper data strobe signal UDQS by means of the first input buffer 110, a second switch 220 which outputs the buffered signal TUDQS as the lower latch data strobe signal PLDQS in response to an inverted control signal BCTRL, and a third switch 230 which receives the signal TLDQS obtained by buffering the lower data strobe signal LDQS by means of the second input buffer 120.

When the received control signal CTRL is set to a first level and the received inverted control signal BCTRL is set to a second level, it means that the input data DATA are 16 bits. Therefore, the second switch 220 is turned off and the third switch 230 is turned on.

Accordingly, the signal TUDQS obtained by buffering the upper data strobe signal UDQS by means of the first input buffer 110 is output as the upper latch data strobe signal PUDQS, and the signal TLDQS obtained by buffering the lower data strobe signal LDQS by means of the second input buffer unit 120 is output as the lower latch data strobe signal PLDQS.

When the received control signal CTRL is set to a second level and the received inverted control signal BCTRL is set to a first level, it means that the input data DATA are 8 bits or 4 bits. Therefore, the second switch 220 is turned on and the third switch 230 is turned off.

Accordingly, the signal TUDQS obtained by buffering the upper data strobe signal UDQS by means of the first input buffer 110 is output as the upper latch data strobe signal PUDQS and the lower latch data strobe signal PLDQS.

As mentioned, the upper latch data strobe signal PUDQS and the lower latch data strobe signal PLDQS are reference signals for latching the data DATA. When they are generated, if a separate switching circuit is added as shown in FIG. 1, speed is reduced and generation of the latched data DATA is delayed.

Further, since generation of the latched data DATA is delayed, the amount of time required for the data DATA to be transferred to the memory array is also increased. As a result, write time is reduced and skew of the data strobe signal caused by the switching unit 130 increases, thereby lengthening a setup/hold time of the data DATA.

SUMMARY OF THE INVENTION

The present invention provides a buffer circuit for selectively outputting an input data strobe signal according to the number of data bits.

The present invention provides a memory system with a buffer circuit for selectively outputting an input data strobe signal according to the number of data bits.

According to an aspect of the present invention, there is provided a buffer circuit for selectively outputting a data strobe signal according to a number of processed data bits. The buffer circuit includes a first buffer unit, a second buffer unit, and a third buffer unit. The first buffer unit amplifies and outputs a first signal. The second buffer unit amplifies and outputs a second signal or outputs the first signal depending on the logic level of a control signal. The third buffer unit amplifies the first signal and either sends or does not send the amplified first signal to the second buffer unit depending on the logic level of an inverted control signal. The logic levels of the control signal and the inverted control signal are determined according to the number of processed data bits.

The control signal may be set to a first level and the inverted control signal may be set to a second level when the number of processed data bits is n, and the control signal may be set to the second level and the inverted control signal may be set to the first level when the number of processed data bits is k. Here, n may be 16 and k maybe 8 or 4.

The first signal and the second signal may be data strobe signals. The buffer circuit may output both the first signal and the second signal when the data are n bits, and may output only the first signal when the data are k bits.

The first buffer unit may include: a first differential amplifier which amplifies the first signal; a first inverter and a second inverter connected in series which buffer and output an output of the first differential amplifier; a first transistor connected between the first inverter and a first voltage and having a gate to which an output of a third inverter for inverting the first voltage is applied; and a second transistor connected between the first inverter and a second voltage and having a gate to which the first voltage is applied.

The second buffer unit may include: a second differential amplifier which amplifies the second signal; a fourth inverter and a fifth inverter connected in series which buffer and output an output of the second differential amplifier; a third transistor connected between the fourth inverter and a first voltage and having a gate to which an output of a sixth inverter for inverting the control signal is applied; and a fourth transistor connected between the fourth inverter and a second voltage and having a gate to which the control signal is applied, wherein the fifth inverter receives and outputs the first signal output from the third buffer unit when the control signal is at a second level.

The third buffer unit may include: a third differential amplifier which amplifies the first signal; a seventh inverter which buffers an output of the third differential amplifier and outputs the buffered output to the second buffer unit; a fifth transistor connected between the seventh inverter and a first voltage and having a gate to which an output of an eighth inverter for inverting the inverted control signal is applied; and a sixth transistor connected between the seventh inverter and a second voltage and having a gate to which the inverted control signal is applied.

The buffer circuit may be mounted on a double data rate synchronous dynamic random access memory. The control signal and the inverted control signal are signals generated by a pad bonding option.

According to another aspect of the present invention, there is provided a memory system for writing data to a memory array in response to a clock signal or reading out the data from the memory array, the memory system comprising a buffer circuit and a latch unit. The buffer circuit receives and outputs a first signal and a second signal in response to a control signal and an inverted control signal when the written or read data are n bits, and outputs the first signal in response to the control signal and the inverted control signal when the data are k bits.

The latch unit latches the data in response to at least one of the first signal and the second signal and outputs the latched data to the memory array.

In one embodiment, the first signal and the second signal are data strobe signals. The control signal can be set to a first level and the inverted control signal can be set to a second level when the data are n bits, and the control signal can be set to a second level and the inverted control signal can be set to a first level when the data are k bits. In one embodiment, n is 16, and k is 8 or 4. A memory system, wherein the memory system is a double data rate synchronous dynamic random access memory. The buffer circuit can include: a first buffer unit which amplifies and outputs the first signal; a second buffer unit which amplifies and outputs the second signal or outputs the first signal according to the logic level of the control signal; and a third buffer unit which amplifies the first signal and either sends or does not send the amplified first signal to the second buffer unit depending on the logic level of the inverted control signal. The logic levels of the control signal and the inverted control signal can be determined by the number of data bits.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
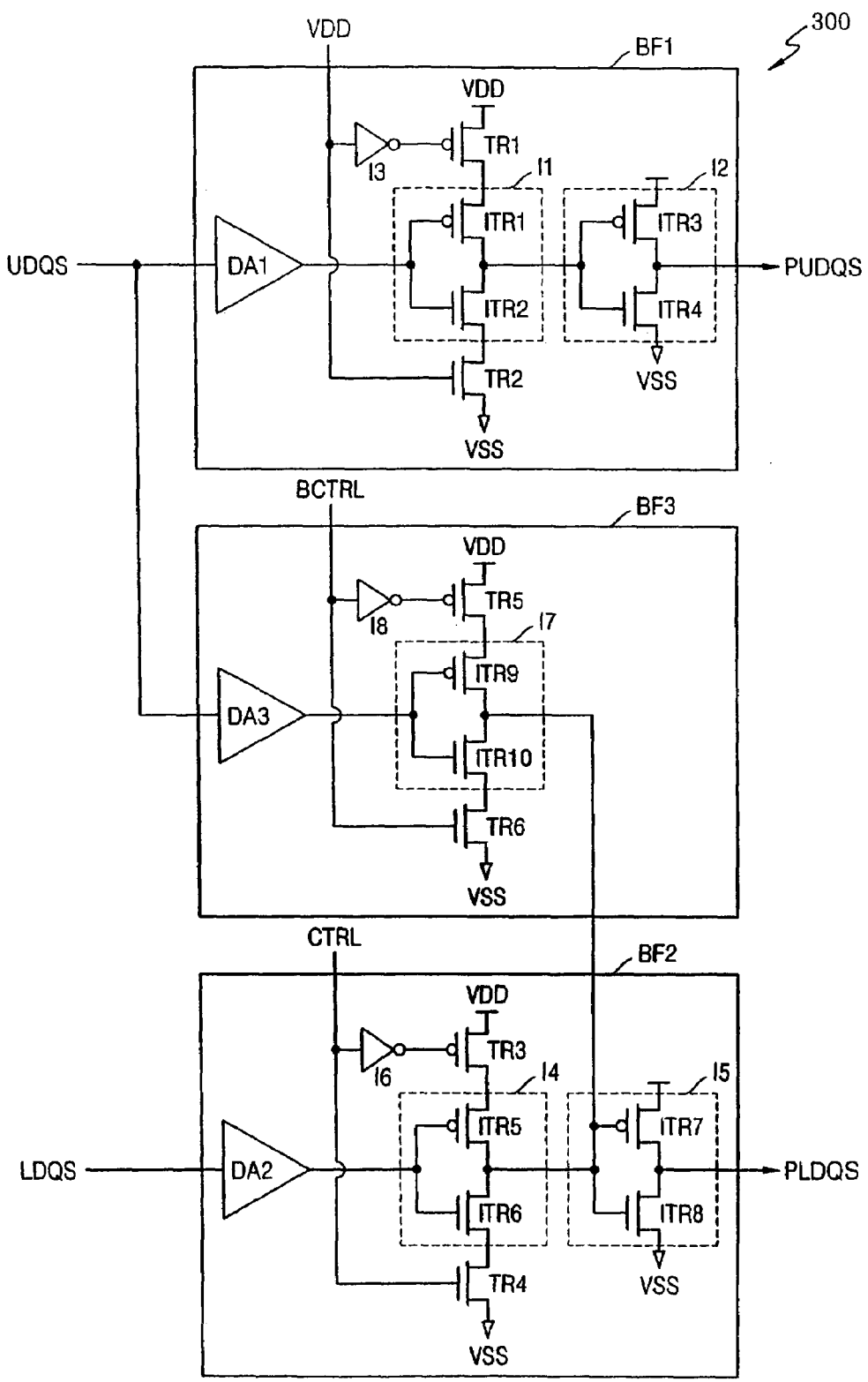
FIG. 3 is a circuit diagram of a buffer circuit according to an embodiment of the present invention.

FIG. 3 is a circuit diagram of a buffer circuit according to aan embodiment of the present invention. The buffer circuit in FIG. 3 replaces the first input buffer 110, the second input buffer 120 and the switching unit 130 of the conventional approach described in connection with FIG. 1. That is, the buffer circuit 300 of FIG. 3 receives the upper data strobe signal UDQS and the lower data strobe signal LDQS and outputs the upper latch data strobe signal PUDQS and lower latch data strobe signal PLDQS to the latch unit 410 (see FIG. 4) to process the input data DATA. The number of data bits n,k in the input data DATA to be processed is used by the buffer circuit 300 to generate the signals PUDQS and PLDQS in accordance with the following description.

Referring to FIG. 3, the buffer circuit 300 includes a first buffer unit BF1, a second buffer unit BF2, and a third buffer unit BF3.

The first buffer unit BF1 amplifies and outputs a first signal UDQS. The second buffer unit BF2 amplifies and outputs a second signal LDQS or outputs the first signal UDQS depending on the logic level of a control signal CTRL.

The third buffer unit BF3 amplifies the first signal UDQS and either sends or does not send the amplified first signal to the second buffer unit BF2 depending on the logic level of an inverted control signal BCTRL. The logic levels of the control signal CTRL and the inverted control signal BCTRL are determined by the number of bits of processed data DATA.

The operation of the buffer circuit according to the preferred embodiment of the present invention will be described in detail with reference to FIG. 3.

The buffer circuit 300 shown in FIG. 3 can function as a conventional buffer for buffering a data strobe signal, and can also switch the data strobe signal according to the number of data bits in the data DATA. Thus, the switching unit 130 shown in the conventional latch structure shown in FIG. 1 can be omitted in FIG. 3 by employing the buffer circuit 300.

The buffer circuit 300 includes the first buffer unit BF1, the second buffer unit BF2, and the third buffer unit BF3.

The first buffer unit BF1 amplifies and outputs the first signal UDQS. The second buffer unit BF2 amplifies and outputs the second signal LDQS or outputs the first signal UDQS according to the logic level of the control signal CTRL. The third buffer unit BF3 amplifies the first signal UDQS and either sends or does not send the amplified first signal to the second buffer unit BF2 depending on the logic level of the inverted control signal BCTRL.

The first through third buffer units BF1, BF2, and BF3 perform switching functions according to the logic level of the control signal CTRL. The logic levels of the control signal CTRL and the inverted control signal BCTRL are determined by the number of data bits in the data DATA.

That is to say, when the number of bits of data DATA to be processed is n, the control signal CTRL is set to a first level and the inverted control signal BCTRL is set to a second level. When the number of bits of data DATA to be processed is k, the control signal CTRL is set to a second level and the inverted control signal BCTRL is set to a first level. Here, n is 16, and k is 8 or 4.

The first signal UDQS and the second signal LDQS are data strobe signals. In particular, the first signal UDQS is an upper data strobe signal and the second signal LDQS is a lower data strobe signal.

When the data DATA are 16 bits, the control signal CTRL is set to the first level and the inverted control signal BCTRL is set to the second level. In this situation, the inverted control signal BCTRL stops the operation of the third buffer unit BF3. Thus, the first buffer unit BF1 of the buffer circuit 300 amplifies the first signal UDQS and outputs the amplified first signal as an upper latch data strobe signal PUDQS. The second buffer unit BF2 of the buffer circuit 300 amplifies the second signal LDQS and outputs the amplified second signal as a lower latch data strobe signal PLDQS.

When the data DATA are 8 bits or 4 bits, the control signal CTRL is set to the second level and the inverted control signal BCTRL is set to the first level. The control signal CTRL stops the operation of the second buffer unit BF2 and the inverted control signal BCTRL begins to operate the third buffer unit BF3.

Therefore, the first buffer unit BF1 of the buffer circuit 300 amplifies the first signal UDQS and outputs the amplified first signal as the upper latch data strobe signal PUDQS.

The third buffer unit BF3 of the buffer circuit 300 amplifies the first signal UDQS and applies the amplified first signal to the second buffer unit BF2. The second buffer unit BF2 outputs the received first signal UDQS as the lower latch data strobe signal PLDQS.

The structures of the first through third buffer units BF1 through BF3 will be described in further detail.

The first buffer unit BF1 includes a first differential amplifier DA1 for amplifying the first signal UDQS, a first inverter I1 and a second inverter I2 connected in series for buffering and outputting an output of the first differential amplifier DA1, a first transistor TR1 connected between the first inverter I1 and a first voltage VDD and having a gate to which an output of a third inverter I3 for inverting a first voltage VDD is applied, and a second transistor TR2 connected between the first inverter I1 and a second voltage VSS and having a gate to which the first voltage VDD is applied.

The first inverter I1 is structured such that a P-channel metal oxide semiconductor (PMOS) transistor ITR1 and an N-channel metal oxide semiconductor (NMOS) transistor ITR2 are connected in series, and the second inverter I2 is structured such that a PMOS transistor ITR3 and an NMOS transistor ITR4 are connected in series. The first-transistor TR1 has a drain connected to a source of the PMOS transistor ITR1 of the first inverter I1 and a source connected to the first voltage VDD.

The first voltage VDD is a power voltage. The third inverter I3 inverts the first voltage VDD and applies the inverted voltage to the first transistor TR1. The first transistor TR1 is a PMOS transistor. Therefore, the first transistor TR1 is always turned on.

The second transistor TR2 has a drain connected to a source of the NMOS transistor ITR2 of the first inverter I1 and a source connected to the second voltage VSS. The second voltage VSS is a ground voltage. The first voltage VDD is applied to a gate of the second transistor TR2. The second transistor TR2 is an NMOS transistor. Accordingly, the second transistor TR2 is always turned on.

Since the first buffer unit BF1 is always operated by the first voltage VDD, the first signal UDQS is always amplified by the first differential amplifier DA1 and is output as the upper latch data strobe signal PUDQS.

The second buffer unit BF2 includes a second differential amplifier DA2 for amplifying the second signal LDQS, a fourth inverter I4 and a fifth inverter I5 connected in series for buffering and outputting an output of the second differential amplifier DA2, and a third transistor TR3 connected between the fourth inverter I4 and a first voltage VDD and having a gate to which an output of a sixth inverter I6 for inverting the control signal CTRL is applied.

The second buffer unit BF2 further includes a fourth transistor TR4 connected between the fourth inverter I4 and a second voltage VSS and having a gate to which the control signal CTRL is applied. The fifth inverter I5 receives and outputs the first signal UDQS output from the third buffer unit BF3 when the control signal CTRL is at the second level.

The third transistor TR3 of the second buffer unit BF2 has a drain connected to a source of a PMOS transistor ITR5 of the fourth inverter I4 and a source connected to the first voltage VDD. The sixth inverter I6 inverts the control signal CTRL and applies the inverted control signal to a gate of the third transistor TR3. The third transistor TR3 is a PMOS transistor.

The fourth transistor TR4 has a drain connected to a source of an NMOS transistor ITR6 of the fourth inverter I4 and a source connected to the second voltage VSS. The control signal CTRL is applied to a gate of the fourth transistor TR4. The fourth transistor TR4 is an NMOS transistor.

When the control signal CTRL is at the first level, the second buffer unit BF2 receives the second signal LDQS and outputs the received second signal as the lower latch data strobe signal PLDQS. When the control signal CTRL is at the second level, the second buffer unit BF2 cuts off the second signal LDQS and receives the output of the third buffer unit BF3 and outputs the received output as the lower latch data strobe signal PLDQS. The output of the third buffer unit BF3 is the first signal UDQS.

When the input data DATA are 16 bits, the control signal CTRL is set to the first level, and when the input data DATA are 8 bits or 4 bits, the control signal CTRL is set to the second level. That is, the second buffer unit BF2 amplifies and outputs the second signal LDQS when the data DATA are 16 bits, whereas the second buffer unit BF2 receives and outputs the output of the third buffer unit BF3 when the data DATA are 8 bits or 4 bits.

The third buffer unit BF3 includes a third differential amplifier DA3 for amplifying the first signal UDQS, a seventh inverter I7 for buffering an output of the third differential amplifier DA3 and outputting the buffered output to the second buffer unit BF2, a fifth transistor TR5 connected between the seventh inverter I7 and a first voltage VDD and having a gate to which an output of an eighth inverter I8 for inverting the inverted control signal BCTRL is applied, and a sixth transistor TR6 connected between the seventh inverter I7 and a second voltage VSS and having a gate to which the inverted control signal BCTRL is applied.

The fifth transistor TR5 of the third buffer unit BF3 has a drain connected to a source of a PMOS transistor ITR9 of the seventh inverter I7 and a source connected to the first voltage VDD. The eighth inverter I8 inverts the inverted control signal BCTRL and applies the inverted control signal to a gate of the fifth transistor TR5. The fifth transistor TR5 is a PMOS transistor.

The sixth transistor TR6 has a drain connected to a source of an NMOS transistor ITR10 of the seventh inverter I7 and a source connected to the second voltage VSS. The inverted control signal BCTRL is applied to a gate of the sixth transistor TR6. The sixth transistor TR6 is an NMOS transistor.

When the inverted control signal BCTRL is at the first level, the third buffer unit BF3 receives the first signal UDQS and applies the received first signal to the second buffer unit BF2. When the inverted control signal BCTRL is at the second level, the third buffer unit BF3 cuts off the first signal UDQS.

When the input data DATA are 16 bits, the inverted control signal BCTRL is set to the second level, and when the input data DATa are 8 bits or 4 bits, the inverted control signal BCTRL is set to the first level. That is, when the data DATA are 16 bits, the third buffer unit BF3 does not allow the first signal UDQS to be applied to the second buffer unit BF2, and when the data DATA are 8 bits or 4 bits, the third buffer unit BF3 receives the first signal UDQS and applies the received first signal to the second buffer unit BF2.

The control signal CTRL and the inverted control signal BCTRL which control the second buffer unit BF2 and the third buffer unit BF3 are signals generated by a pad bonding option. That is, a wire bonding is differentiated according to whether the data DATA are 16 bits, or 8 or 4 bits to determine the level of the control signal CTRL.

Figure 4:
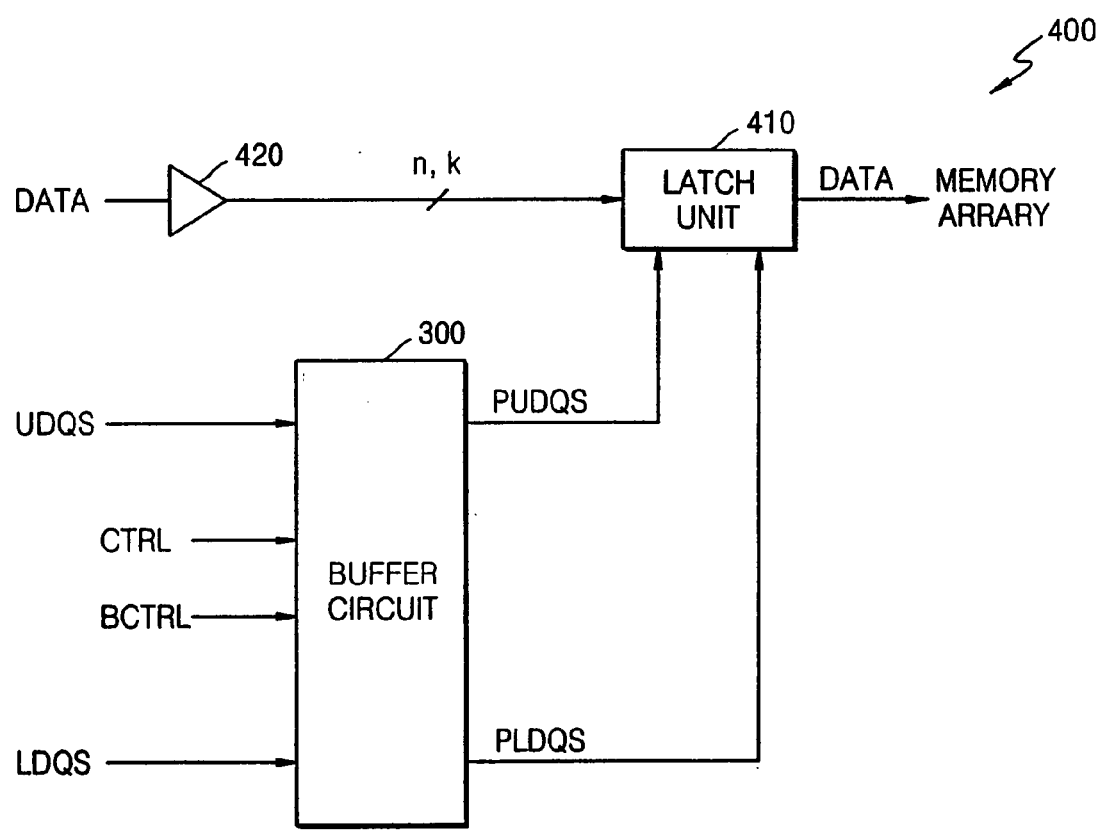
FIG. 4 is a block diagram of a memory system provided with the buffer circuit shown in FIG. 3.

FIG. 4 is a block diagram of a memory system provided with the buffer circuit shown in FIG. 3.

Referring to FIG. 4, a memory system 400 writes data DATA to a memory array in response to a clock signal (not shown) or reads the data DATA from the memory array. The memory system 400 includes a buffer circuit 300 and a latch unit 410.

The buffer circuit 300 of FIG. 4 is the same as the buffer circuit shown in FIG. 3. When the data DATA are 16 bits, the buffer circuit 300 amplifies a first signal UDQS and outputs the amplified first signal as an upper latch data strobe signal PUDQS, and amplifies a second signal LDQS and outputs the amplified second signal as a lower latch data strobe signal PLDQS.

The latch unit 410 latches the data DATA in response to the upper latch data strobe signal PUDQS and the lower latch data strobe signal PLDQS, and applies the latched data DATA to the memory array. A buffer 420 buffers the data DATA.

When the data DATA are 8 bits or 4 bits, the buffer circuit 300 amplifies the first signal UDQS and outputs the amplified first signal as the upper latch data strobe signal PUDQS, and amplifies the first signal UDQS instead of the second signal LDQS and outputs the amplified first signal as the lower latch data strobe signal PLDQS.

The latch unit 410 latches the data DATA in response to the upper latch data strobe signal PUDQS and the lower latch data strobe signal PLDQS, and applies the latched data DATA to the memory array.

Figure 1:
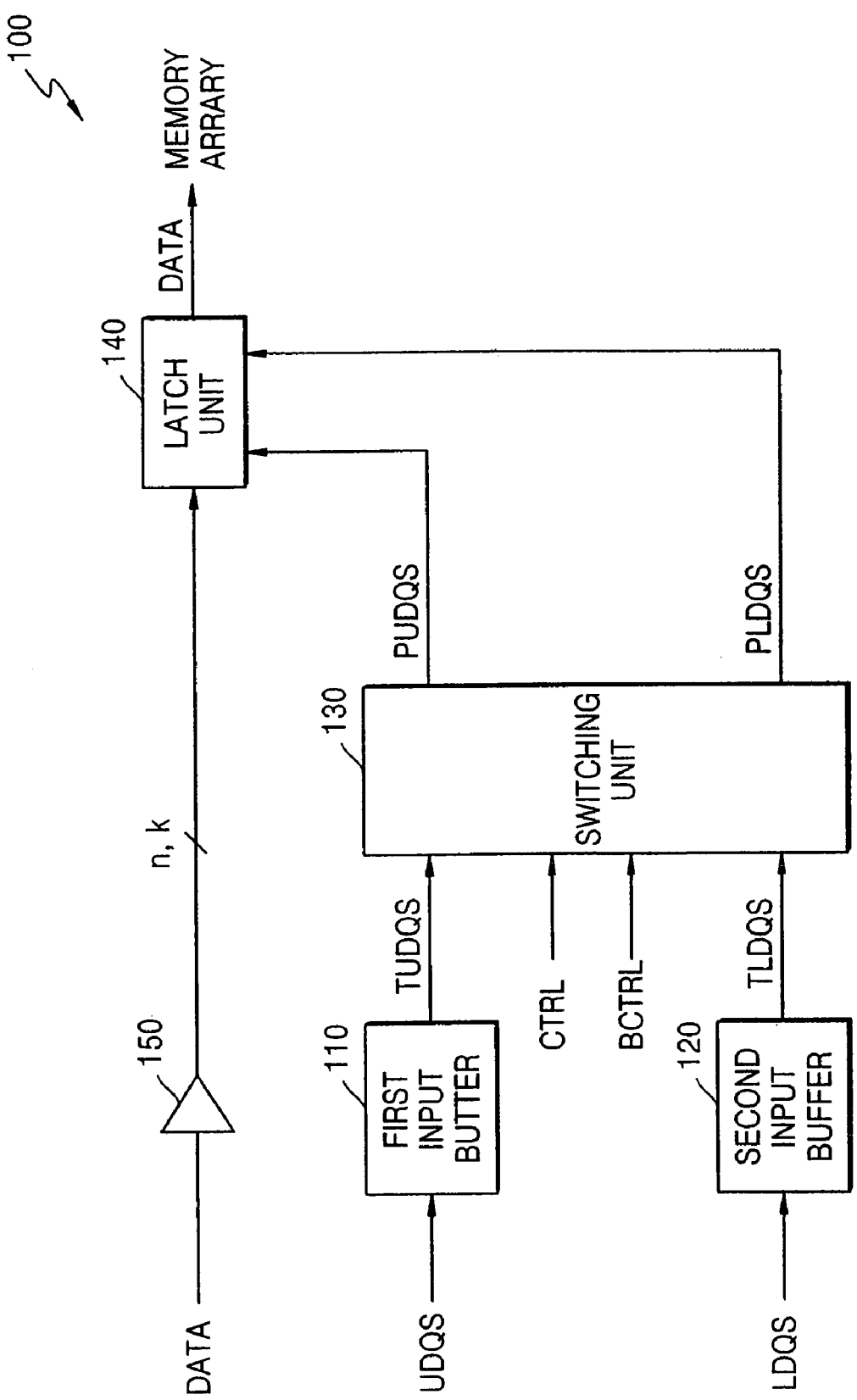
FIG. 1 is a block diagram illustrating a process in which data are synchronized with a data strobe signal to be applied to a memory array.
Figure 2:
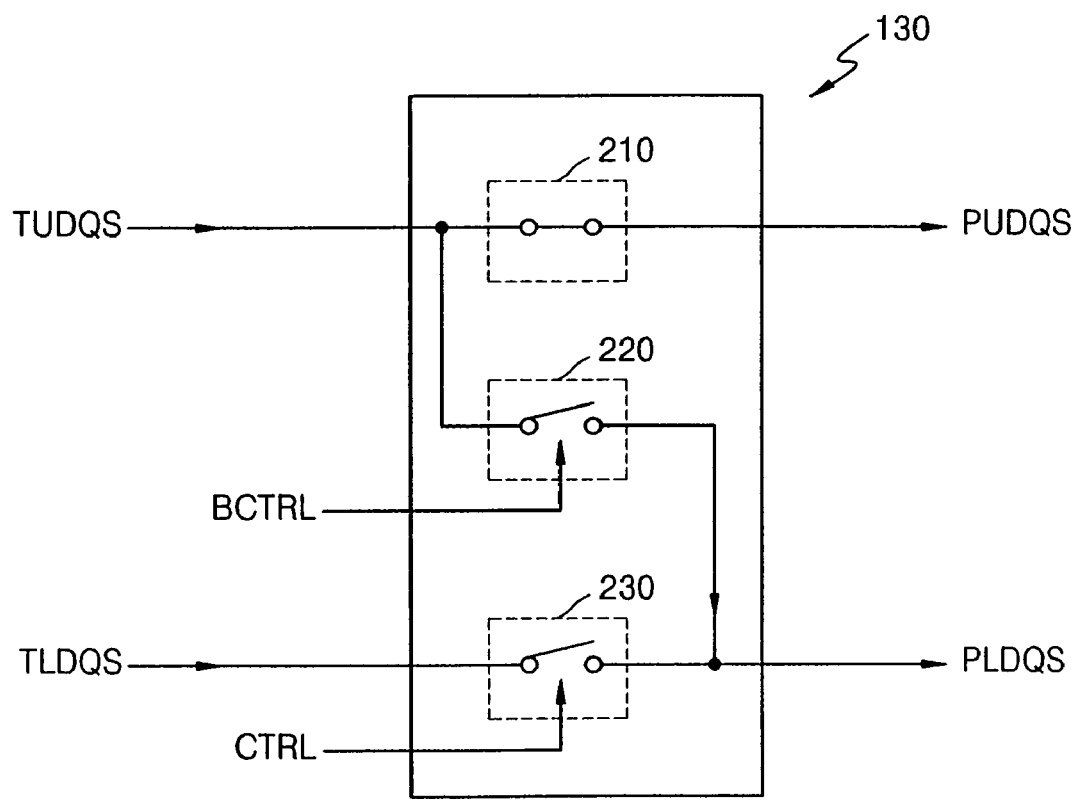
FIG. 2 is a block diagram of a switching unit shown in FIG. 1.

When being compared with the conventional memory system of FIG. 1, since the buffer circuit 300 performs the function of the switching unit 130, a speed drop in the data strobe signal caused by the switching unit 130 can be solved. The memory system of FIG. 4 can be used as a double data rate synchronous dynamic random access memory (DRAM).

As described above, since the buffer circuit and the memory system select the data strobe signal to output according to the number of data bits, a point of time when the data are latched using the data strobe signal can be advanced, and a setup/hold time of the data can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A buffer circuit for selectively outputting a data strobe signal according to a number of processed data bits, the buffer circuit comprising:
    a first buffer unit which amplifies and outputs a first signal;
    a second buffer unit which amplifies and outputs a second signal or outputs the first signal according to the logic level of a control signal;
    a third buffer unit which amplifies the first signal and either sends or does not send the amplified first signal to the second buffer unit depending on the logic level of an inverted control signal,
    wherein the logic levels of the control signal and the inverted control signal are determined according to the number of processed data bits.

2. The buffer circuit of claim 1, wherein the control signal is set to a first level and the inverted control signal is set to a second level when the number of processed data bits is n, and the control signal is set to the second level and the inverted control signal is set to the first level when the number of processed data bits is k.

3. The buffer circuit of claim 2, wherein n is 16 and k is 8 or 4.

4. The buffer circuit of claim 3, wherein the first signal and the second signal are data strobe signals.

5. The buffer circuit of claim 3, wherein the buffer circuit outputs both the first signal and the second signal when the data are n bits, and outputs only the first signal when the data are k bits.

6. The buffer circuit of claim 1, wherein the first buffer unit includes:
 a first differential amplifier which amplifies the first signal;
 a first inverter and a second inverter connected in series which buffer and output an output of the differential amplifier;
 a first transistor connected between the first inverter and a first voltage and having a gate to which an output of a third inverter for inverting the first voltage is applied; and
 a second transistor connected between the first inverter and a second voltage and having a gate to which the first voltage is applied.

7. The buffer circuit of claim 1, wherein the second buffer unit includes:
 a differential amplifier which amplifies the second signal;
 a first inverter and a second inverter connected in series, which buffer and output an output of the differential amplifier;
 a first transistor connected between the first inverter and a first voltage and having a gate to which an output of a third inverter for inverting the control signal is applied; and
 a second transistor connected between the first inverter and a second voltage and having a gate to which the control signal is applied,
 wherein the second inverter receives and outputs the first signal output from the third buffer unit when the control signal is at a second level.

8. The buffer circuit of claim 1, wherein the third buffer unit includes:
 a differential amplifier which amplifies the first signal;
 a first inverter which buffers an output of the differential amplifier and outputs the buffered output to the second buffer unit;
 a first transistor connected between the first inverter and a first voltage and having a gate to which an output of an second inverter for inverting the inverted control signal is applied; and
 a second transistor connected between the first inverter and a second voltage and having a gate to which the inverted control signal is applied.

9. The buffer circuit of claim 1, wherein the buffer circuit is mounted on a double data rate synchronous dynamic random access memory.

10. The buffer circuit of claim 1, wherein the control signal and the inverted control signal are signals generated by a pad bonding option.

* * * * *

UNITED STATES PATENT AND TRADEMARK OFFICE
CERTIFICATE OF CORRECTION

PATENT NO. : 7,123,520 B2  Page 1 of 1
APPLICATION NO. : 10/884723
DATED : October 17, 2006
INVENTOR(S) : Sung-min Seo et al.

It is certified that error appears in the above-identified patent and that said Letters Patent is hereby corrected as shown below:

Column 4, line 16, delete "A memory system, wherein" and insert --In one embodiment,--

Signed and Sealed this

Tenth Day of April, 2007

JON W. DUDAS
*Director of the United States Patent and Trademark Office*